United States Patent [19]
Yoshida

[11] Patent Number: 5,410,572
[45] Date of Patent: Apr. 25, 1995

[54] PHASE LOCKED LOOP CIRCUIT

[75] Inventor: Koichi Yoshida, Hyogo, Japan

[73] Assignee: Mitsubishi Denki Kabushiki Kaisha, Tokyo, Japan

[21] Appl. No.: 114,363

[22] Filed: Sep. 1, 1993

[30] Foreign Application Priority Data

Dec. 25, 1992 [JP] Japan .................. 4-346449

[51] Int. Cl.$^6$ ............................................ H03D 3/24
[52] U.S. Cl. ..................................... 375/376; 331/14
[58] Field of Search ................... 375/118, 119, 120; 331/14; 328/63, 155; 455/260, 265

[56] References Cited

U.S. PATENT DOCUMENTS

| 4,031,483 | 6/1977 | Formeister | 331/17 |
| 4,617,679 | 10/1986 | Brooks | 375/119 |
| 4,635,280 | 1/1987 | Smith et al. | 375/120 |
| 4,918,404 | 4/1990 | Vitiello et al. | 331/14 |
| 5,055,801 | 10/1991 | Koga et al. | 331/14 |
| 5,202,906 | 4/1993 | Saito et al. | 331/14 |

FOREIGN PATENT DOCUMENTS

| 0479237 | 4/1992 | European Pat. Off. . |
| 2951022 | 7/1981 | Germany . |
| 3441143 | of 1984 | Germany . |
| 3735188 | 4/1989 | Germany . |
| 62-300791 | of 1987 | Japan . |
| 2304254 | of 1990 | Japan . |
| 4182319 | 7/1992 | Japan . |

OTHER PUBLICATIONS

"Official Action of the German Patent Office"; Aug. 16, 1994.
"Precise Simulation Model of Pulse-Phase Control Circuit for Bulk Power HVDC Transmission System", IEEE paper magazin vol. 106, No. 4, pp. 55-62 by Iwao Matori, Junichi Arai Yasuji Skine, Masahiro Ishikawa, Tsukushi Hara, Yutaka Kokai.

Primary Examiner—Stephen Chin
Assistant Examiner—Young Tse
Attorney, Agent, or Firm—Leydig, Voit & Mayer

[57] ABSTRACT

In a disclosed PLL circuit, a constant voltage output by a constant voltage power supply 6 for obtaining a signal with a frequency equivalent to that obtained in a synchronized state is added to a signal output by a filter 3 by means of an adder 7. A signal output by the adder 7 representing the sum of the voltage output by the constant-voltage power supply and the signal output by the filter is supplied to a voltage-controlled oscillator 4. With a reference signal Pi supplied, the PLL circuit functions like an ordinary PLL circuit. When the signal Pi becomes unavailable, however, a signal output by a reference-signal-input detecting circuit 5 for monitoring the reference signal Pi puts integrating components employed by the filter 3 in a short-circuit state, initializing information accumulated in the integrating components. In addition, the output of the filter is set to zero. In this state, only the constant voltage output by the constant-voltage power supply 6 is therefore supplied to the voltage-controlled oscillator 4.

7 Claims, 12 Drawing Sheets

PHASE LOCKED LOOP CIRCUIT

BACKGROUND OF THE INVENTION

1. Field of the Invention

The present invention relates to a phase locked loop circuit, referred to hereafter as a PLL circuit, for producing an output signal with an oscillation frequency equal in magnitude to a multiple of the frequency of an input signal.

2. Description of the Prior Art

In general, a PLL circuit is used for producing a signal with a frequency equal in magnitude to a multiple of the frequency of an input signal referred to hereafter as a reference signal. The multiple frequency is also used for controlling the frequency of an oscillator. The frequency multiplication factor, that is, the ratio of the frequency of the signal produced by the PLL circuit to the frequency of the reference signal, is kept at a constant value even if the latter fluctuates. In other words, an output signal is produced always at a frequency equal in magnitude to a multiple of the frequency of the reference signal, faithfully following variations in reference-signal frequency.

Conventional PLL circuits of the type described above include the HD14046B series described on pages 103 to 106 of the "Hitachi CMOS Data Book" issued in March, 1983, by Hitachi, Ltd. A block diagram of the PLL circuit is shown in FIG. 11. Reference numeral 1 shown in the figure is a phase comparator for recognizing a discrepancy in timing between the rising edge of an input signal Pi as a reference signal, and a signal $P_{FB}$ output by a frequency divider 2 to be described in detail later. The phase comparator recognizes a timing discrepancy as a phase difference between the two signals. The phase comparator 1 outputs a signal $P_1$ representing the difference in phase. The phase-difference signal $P_1$ is smoothed by a filter 3, being converted into a direct-current voltage $VCO_{in}$ which also represents the difference in phase as well. A voltage-controlled oscillator 4 generates a pulse-train signal Po as an output of the PLL circuit. The train of pulses Po, which has a frequency proportional to the direct-current voltage $VCO_{in}$ output by the filter 3, is also supplied to the frequency divider 2.

Waveforms of signals appearing at a variety of points in the conventional PLL circuit described above are shown in FIG. 12. The principle of operation of the conventional PLL circuit is described in detail by referring to this figure. When the phase of the signal $P_{FB}$ output by the frequency divider 2 lags behind that of the input signal Pi serving as a synchronization reference by a period of time (a) shown in FIG. 12, that is, when the frequency of the pulse-train signal Po is too low, the signal $P_1$ output by the phase comparator 1 increases in magnitude, indicating that the lagging phase of the signal $P_{FB}$ results in a positive difference in phase. This positive difference in phase, in turn, causes the direct-current voltage $VCO_{in}$ output by the filter 3 to be supplied to the voltage-controlled oscillator 4 also to rise as well. Accordingly, the frequency of the pulse-train signal Po output by the voltage-controlled oscillator 4 also increases. As a result, the phase of the signal $P_{FB}$ output by the frequency divider 2 is shifted forward.

As a result of the operation to shift forward the phase of the signal $P_{FB}$ output by the frequency divider 2 described above, on the other hand, the phase of the signal $P_{FB}$ output by the frequency divider 2 this time leads ahead of that of the reference signal Pi by a period of time (b) shown in FIG. 12, that is, the frequency of the pulse-train signal Po becomes too high. In this case, the signal $P_1$ output by the phase comparator 1 decreases in magnitude, indicating that the leading phase of the signal $P_{FB}$ results in a negative difference in phase. This negative difference in phase causes the direct-current voltage $VCO_{in}$ output by the filter 3 to be supplied to the voltage-controlled oscillator 4 also to fall as well. Accordingly, the frequency of the pulse-train signal Po output by the voltage-controlled oscillator 4 also decreases. As a result, the phase of the signal $P_{FB}$ output by the frequency divider 2 is shifted backward. The operations to shift the phase of the signal $P_{FB}$ back and forth described above are repeated.

In this way, the PLL circuit forms a negative-feedback automatic control circuit with the signal $P_{FB}$ output by the frequency divider 2 used as a feedback signal for the reference signal Pi. As described above, the phase of the signal $P_{FB}$ output by the frequency divider 2 repeatedly lags behind and leads ahead of that of the reference signal Pi, resulting in positive and negative differences in phase alternately. While this operation is taking place, the two signals are finally brought to a synchronized state in which there is almost no difference in phase and, hence, nearly no difference in frequency between the two signals.

Let fi be the frequency of the reference signal Pi, fo be the frequency of the pulse-train signal Po output by the voltage-controlled oscillator 4, 1/n be the frequency-division ratio of the frequency divider 2 and $f_{FB}$ be the frequency of the signal $P_{FB}$ output by the frequency divider 2. In the synchronized state, $fi = f_{FB}$. As a result, $fo = f_{FB} \times n = fi \times n$, which implies that the pulse-train signal Po has a frequency n times that of the reference signal Pi.

An operation in a case that the reference Pi disappears due to some reasons is described as follows. Assuming that the reference signal Pi stops at a point (1) shown in FIG. 12. In this case, the signal $P_{FB}$ output by the frequency divider 2 is recognized by the phase comparator 1 to have a phase leading ahead of that of the reference signal Pi, that is, the frequency of the pulse-train signal Po is considered to be too high. The leading phase of the signal $P_{FB}$ causes the negative-feedback automatic control system to respond by making an attempt to shift the phase backward. Since the reference signal Pi has been stopped, another attempt is again made to shift the phase backward furthermore, causing the direct-current voltage $VCO_{in}$ output by the filter 3 or the voltage supplied to the voltage-controlled oscillator 4 to attain a lowest level in a short period of time. As a result, the voltage-controlled oscillator 4 outputs a train of pulses Po at a lowest possible frequency.

When the reference signal Pi is restored at a point (2) where the system is in an uncontrollable state, the signal $P_{FB}$ output by the frequency divider 2 is again recognized by the phase comparator 1 to still have a phase leading ahead of that the reference signal Pi. Thus, a request is made to shift the phase backward in spite of the fact that the direct-current voltage $VCO_{in}$ output by the filter 3 is saturated at the lowest level. At the next phase-comparison point, however, the signal $P_{FB}$ output by the frequency divider 2 is recognized by the phase comparator 1 to have a phase lagging behind that of the reference signal Pi, that is, the frequency of the pulse-train signal Po is considered to be too low for the first time since the stoppage of the reference signal Pi. Accordingly, the negative-feedback automatic control system responds by making an attempt to shift the phase forward in order to raise the frequency of the pulse-train signal Po.

In general, however, the filter 3 includes large integrating components. Accordingly, the direct-current voltage $VCO_{in}$ output by the filter 3 which has once been saturated rises slowly. It is not until the phase comparator 1 has compared the phases several times and a command to shift forward the phase of the signal $P_{FB}$ has been issued repeatedly that the direct-current voltage $VCO_{in}$ supplied to the voltage-controlled oscillator 4 finally attains the synchronized-phase level.

The PLL circuit can also be applied to power-control equipment such as an uninterruptable power supply and a reactive-power compensating apparatus. In the case of such a field of applications, the reference signal Pi is in general derived from the commercial power supply. The PLL circuit is, therefore, used to generate a signal having a frequency equal in magnitude to a multiple of the frequency of the commercial power supply. With a frequency divider having a frequency-division ratio of 1/360, for example, the frequency of the pulse-train signal Po output by the PLL circuit is 360 times that of the reference signal Pi. That is to say, if one period of the commercial power supply is 360 degrees, then one period of the pulse-train signal Po is 1 degree. By using the signal Po as a reference, the phase of the commercial power supply can thus be controlled at a resolution of 1 degree.

Power interruption occasionally occurs due to, among other things, the falling of a thunderbolt. Since the reference signal Pi is derived from the commercial power supply, the power interruption causes the reference signal Pi to disappear. In spite of that, the power control apparatus cited above is required to continue functioning as if the commercial power supply remained continuously available even if the commercial power supply serving as the source of the reference signal Pi is interrupted as is the case with the falling of a thunderbolt. It is also necessary to have smooth and shockless transition to the normal control operation at recovery from such power interruption even if the reference signal Pi is derived from the commercial power supply.

It is therefore necessary to devise a new PLL circuit applicable to such a control field, wherein a pulse-train signal Po can be output with the same oscillation frequency as that obtained in a synchronized state even if the reference signal Pi disappears. The problem of the conventional PLL circuit is that when the reference signal Pi becomes unavailable, an oscillation signal having a very low frequency inherent in the PLL circuit can merely be obtained.

In addition, the PLL circuit in general employs a filter comprising large integrating components. Accordingly, the filter remains in a saturated state entered at the removal of the reference signal Pi for a while even after the reference signal Pi is restored, being incapable of responding promptly. Moreover, the difference in frequency between the reference signal Pi and the feedback signal $P_{FB}$ is large at the time the reference signal Pi is restored. It is therefore not until the phase comparator 1 has compared the phases of the signals Pi and $P_{FB}$ several times and a command to shift forward the phase of the signal $P_{FB}$ has been issued repeatedly that the direct-current voltage $VCO_{in}$ supplied to the voltage-controlled oscillator 4 finally attains the synchronized-phase level.

As described above, the conventional PLL circuit has a problem that a state with unsynchronized phases is prolonged at the restoration of the reference signal a while after the stoppage thereof. This is because it takes time for the conventional PLL circuit to return to a synchronized state, wherein the two phases match each other, due to, among other things, the recovery timing of the reference signal Pi.

SUMMARY OF THE INVENTION

Addressing the problems described above, it is a first object of the present invention to provide a PLL circuit that is capable of producing an output signal with an oscillation frequency equivalent to a frequency obtained in a synchronized state even if a reference signal supplied thereto becomes unavailable.

It is a second object of the present invention to provide a PLL circuit that has a short recovery time at restoration of the reference signal that has once become unavailable.

In order to achieve the above objects, the PLL circuit provided by the present invention employs a reference-signal-input detecting circuit or an out-of-phase-synchronization detector for detecting disappearance of the reference signal or the occurrence of an out-of-phase-synchronization state caused by the disappearance of the reference signal and, in the event of a detected reference-signal disappearance or a detected out-of-phase-synchronization occurrence, the PLL circuit actuates a switch circuit in order to output a signal equivalent to that obtained in a synchronized state immediately and to restore information accumulated in integrating components employed in a filter to an initial state. The PLL circuit is therefore capable of producing an output signal with an oscillation frequency equivalent to a frequency obtained in the synchronized state even if the reference signal supplied thereto becomes unavailable. In addition, the recovery time to the synchronized state at the restoration of the reference signal can thus be shortened.

DETAILED DESCRIPTION OF THE PREFERRED EMBODIMENTS

The present invention will become apparent from the following detailed description of preferred embodiments with reference to the accompanying diagrams.

First Embodiment

Figure 1:
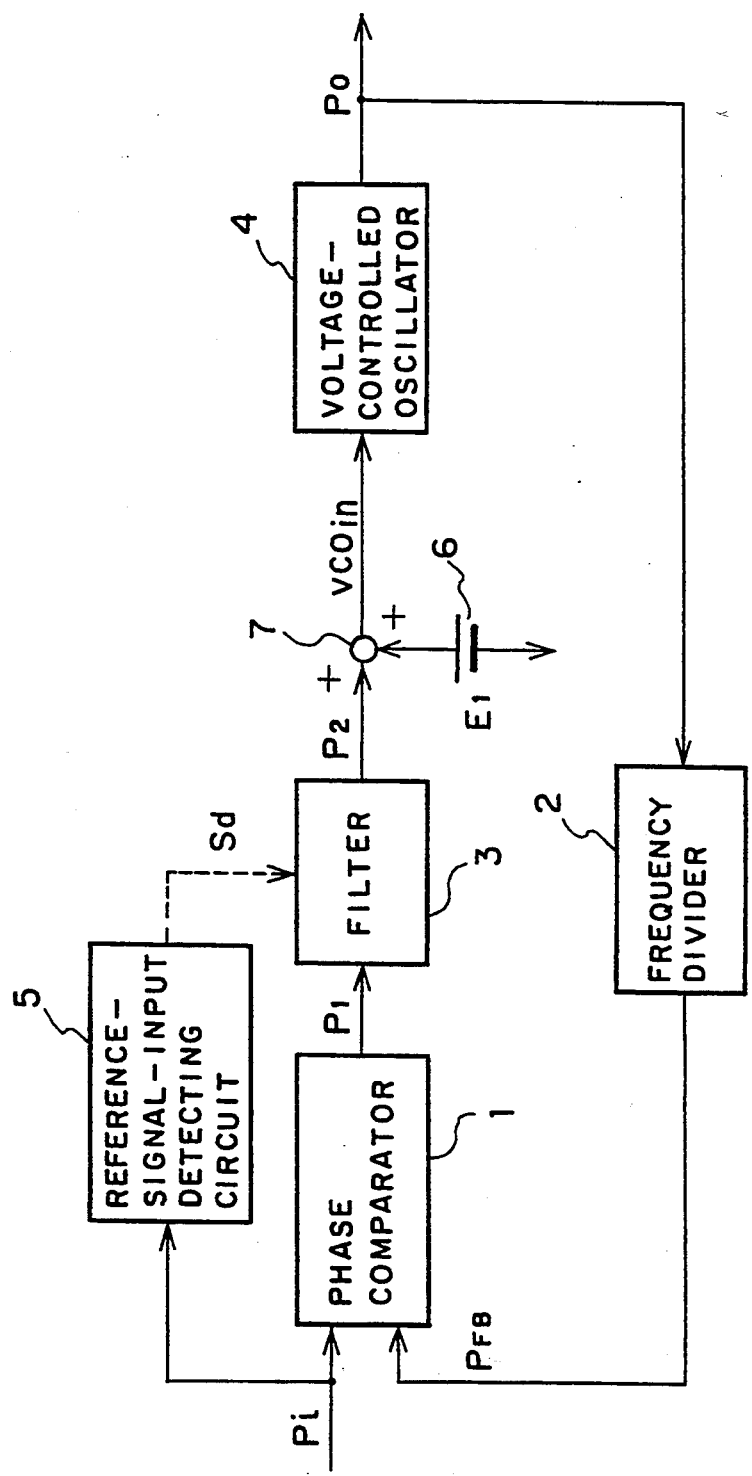
FIG. 1 is a block diagram of a first embodiment provided by the present invention.
Figure 12:
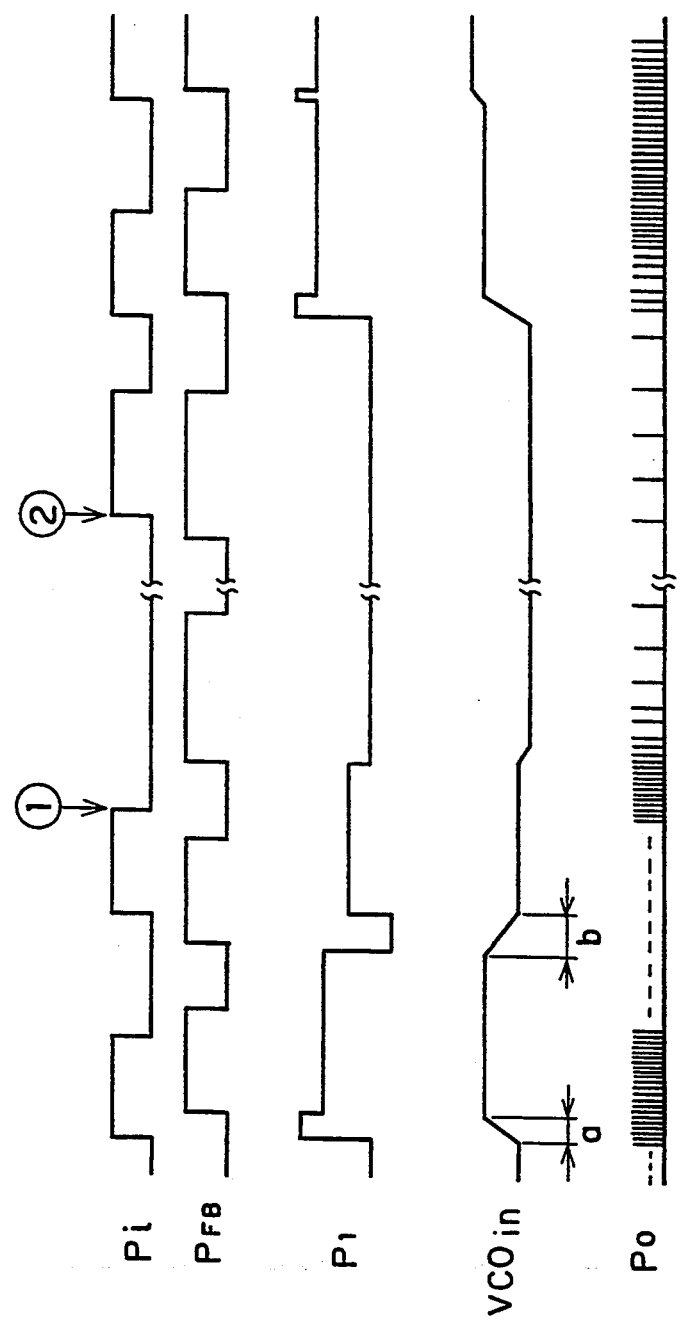
FIG. 12 is a diagram showing waveforms of signals appearing at a variety of points in the conventional PLL circuit shown in FIG. 10.

A block diagram of a first embodiment provided by the present invention is shown in FIG. 1. The same reference numerals as those shown in FIG. 12 are used in FIG. 1 to denote identical or equivalent components and elements of FIG. 12 the description of which is not repeated here. Also unless specified otherwise, the same notations as those used in the description of the conventional PLL circuit are used in the following description to denote the same electrical quantities. Reference numeral 6 shown in FIG. 1 denotes a constant-voltage power supply whereas reference numeral 7 is an adder for adding a signal P2 output by a filter 3 to a signal $E_1$ output by the constant-voltage power supply 6. A result of the addition is supplied to a voltage-controlled oscillator 4.

Figure 2:
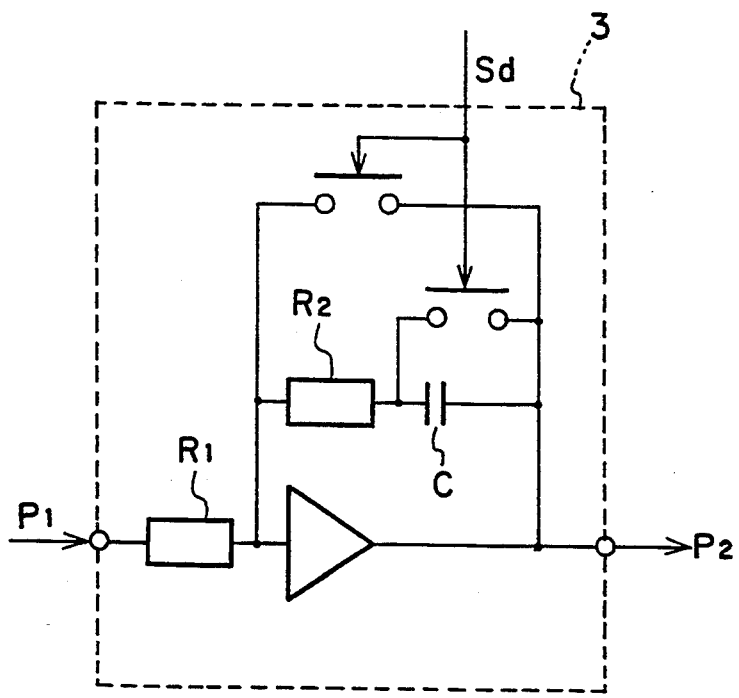
FIG. 2 is a diagram showing a typical filter employed in the first embodiment shown in FIG. 1.

Reference numeral 5 is a reference-signal-input detecting circuit for monitoring the incoming of a reference signal Pi. In the event of detected disappearance of the reference signal Pi, the reference-signal-input detecting circuit 5 asserts a signal Sd to notify the filter 3 that the reference signal Pi has become unavailable. Receiving the signal Sd, the filter 3 puts integrating components employed therein in a short-circuit condition, setting information accumulated in the integrating components to an initial state. Typically, the filter 3 comprises a condenser C, resistors $R_1$ and $R_2$, an operational amplifier and switches as shown in FIG. 2. When the signal Sd is received, the condenser C and the resistor $R_2$ are put in a short-circuit state by the switches.

Let the frequency-division ratio of a frequency divider 2 be 1/n and the frequency of the reference signal Pi be almost constant and have an average value of $fi_{AVR}$. The constant-voltage power supply 6 is set at a voltage $E_1$ which drives the voltage-controlled oscillator 4 to generate a pulse-train signal Po with a frequency of $(fi_{AVR} \times n)$.

With the reference signal Pi supplied, the reference-signal-input detecting circuit 5 requests the filter 3 not to put the integrating components in a short-circuit state and, hence, to accomplish filtering functions normally.

Figure 3:
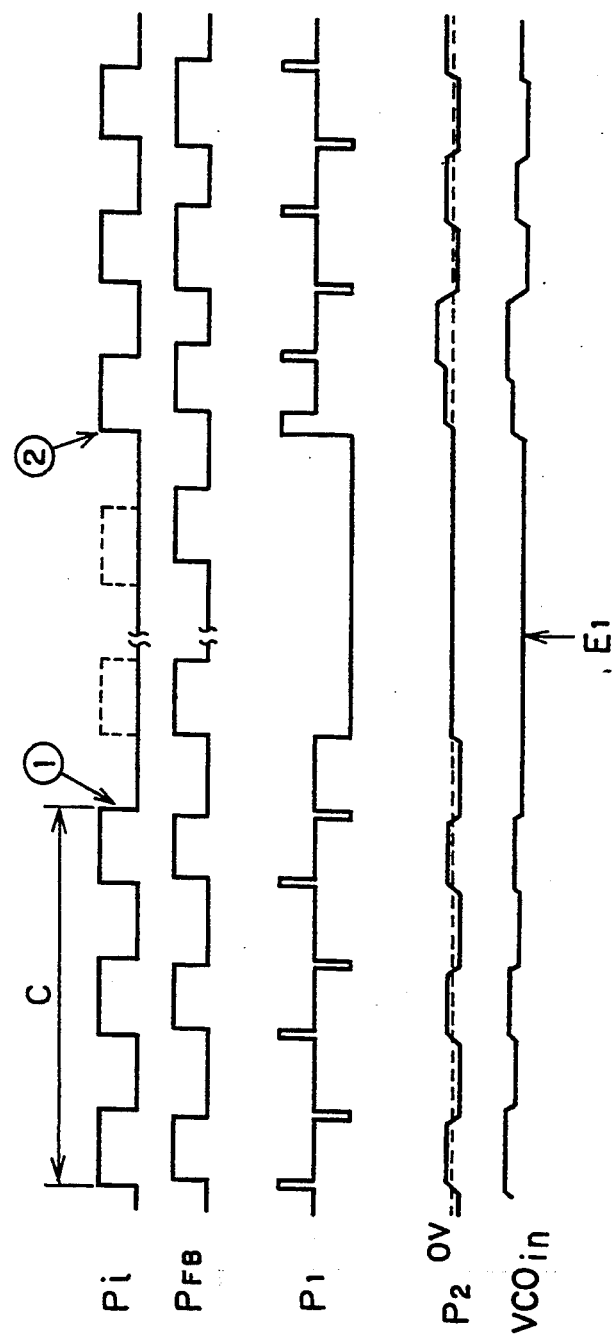
FIG. 3 is a diagram showing waveforms of signals appearing at a variety of points in the first embodiment shown in FIG. 1.

Waveforms of a variety of points of the circuit shown in FIG. 1 are shown in FIG. 3. Much like the conventional PLL circuit described earlier, during a period (c) shown in FIG. 3, the PLL circuit shown in FIG. 1 functions as an automatic control system negatively feeding back the signal $P_{FB}$ output by the frequency divider 2 as a negative feedback signal and taking the signal Pi as a reference. During this period, the signal $P_{FB}$ output by the frequency divider 2 repeatedly lags behind and leads ahead of the reference signal Pi by small differences in phase. While these phenomena are taking place, the PLL circuit finally enters a synchronized state, outputting a pulse-train signal Po with a frequency $fo = fi \times n$.

Here, the sum of the voltage $E_1$ output by the constant-voltage power supply $E_1$ and a voltage $P_2$ output by the filter 3 is supplied to the voltage-controlled oscillator 4 as a direct-current input voltage $VCO_{in}$. The voltage $E_1$ output by the constant-voltage power supply 6 is set at a value that causes the voltage-controlled oscillator 4 to oscillate at $(fi_{AVR} \times n)$, a frequency almost equal to that of the synchronized state. Therefore, the filter 3 outputs the voltage $P_2$ with a magnitude just required to compensate for small fluctuations of the frequency fi of the reference signal Pi from the average frequency $fi_{AVR}$. Small increases and decreases in magnitude of the voltage $P_2$ output by the filter 3 compensate for the fluctuations in frequency fi, resulting in an operation with a high degree of stability.

Next, consider an operation with the reference signal Pi becoming unavailable for some reasons.

Let the reference signal Pi be stopped at a point (1) shown in FIG. 3 for example. In this case, the reference-signal-input detecting circuit 5 detects the disappearance of the reference signal Pi, asserting the signal Sd. Receiving the signal Sd, the filter 3 actuates the switches thereof. The actuation of the switches put the integrating components comprising the condenser C and the resistor R in a short-circuit state, restoring them to the initial condition. At the same time, the filter 3 outputs a signal having a voltage of 0V.

As a result, only the voltage $E_1$ output by the constant-voltage power supply 6 is now applied to the voltage-controlled oscillator 4 as the direct-current input voltage $VCO_{in}$. In this state, the voltage-controlled oscillator 4 generates the pulse-train signal Po having a frequency of $(fi_{AVR} \times n)$ while the frequency divider 2 outputs the signal $P_{FB}$ with its frequency $f_{FB}$ equal to the average frequency $f_{AVR}$.

Next, consider a case in which the reference signal Pi is restored while the PLL circuit is in the state described above.

When the reference signal Pi is restored at a point (2) shown in FIG. 3, the reference-signal-input detecting circuit 5 detects the reappearance of the reference signal Pi, discontinuing the assertion of the signal Sd. The deassertion of the signal Sd restores the original functions of the filter 3, causing the PLL circuit to operate normally.

At the point (2) shown in FIG. 3, the PLL circuit operates as if the reference signal Pi had not disappeared. When the reference signal Pi is restored after a short absence period while the PLL circuit is producing an output signal with a phase as if the reference signal Pi had not disappeared, the phase and frequency of the restored reference signal Pi almost match those of the signal $P_{FB}$ output by the frequency divider 2. Accordingly, the PLL circuit can be put in a synchronized state in an extremely short period of time.

When the reference signal Pi is restored after a long absence period and the phase of the restored reference signal Pi is arbitrary, the difference in phase between the reference signal Pi and the signal $P_{FB}$ output by the frequency divider 2 may be large in some cases. Even in such cases, however, the time to put back the PLL circuit in the synchronized state is shorter than the conventional PLL circuit. This is because the voltage-controlled oscillator 4 is already oscillating at a frequency close to the frequency obtained in the synchronized state and the integrating components employed in the filter 3 have been put in a short-circuit state during the absence period of the reference signal Pi, pulling out the filter 3 from a saturated condition.

Second Embodiment

Figure 4:
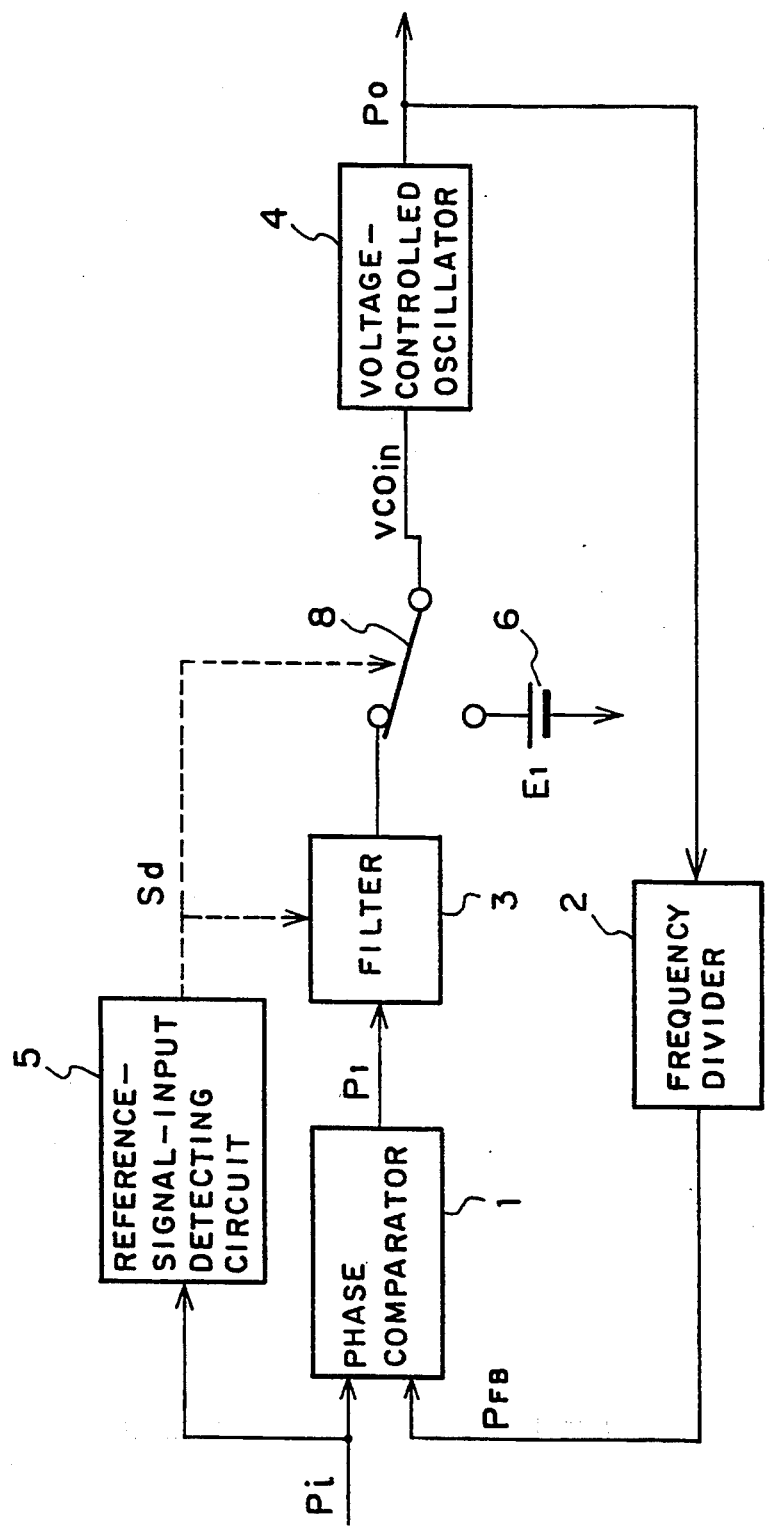
FIG. 4 is a block diagram of a second embodiment provided by the present invention.

A second embodiment of the present invention is shown in FIG. 4. Note that the same reference numerals as those shown in FIG. 1 are used in FIG. 4 to denote the same or equivalent components or elements. Also unless specified otherwise, the same notations as those used in the description of the first embodiment are used in the following explanation to denote the same electrical quantities. Reference numeral 6 shown in the figure is a constant-voltage power supply. Receiving a signal Sd from a reference-signal-input detecting circuit 5, a switch 8 selects either a signal output by a filter 3 or a signal output by the constant-voltage power supply 6 as an input voltage $VCO_{in}$ to be supplied to a voltage-controlled oscillator 4.

When the signal Sd is asserted, the filter 3 actuates switches therein in order to put integrating components employed in the filter 3 in a short-circuit state, initializing information accumulated in the integrating components. It should be noted here, however, that the constant-voltage power supply 6 can be a kind of source that generates a predetermined voltage by holding electric charge as in the case of a condenser. The constant-voltage power supply 6 is set at a voltage El which causes the voltage-controlled oscillator 4 to produce a pulse-train signal Po with a frequency equal to $(fi_{AVR} \times n)$.

With a reference signal Pi supplied, the switch 8 selects the signal output by the filter 3 as the input voltage $VCO_{in}$ fed to the voltage-controlled oscillator 4. In this state, the PLL circuit executes its original native functions, driving the voltage-controlled oscillator 4 to output the signal Po with a frequency fo equal to $(fi \times n)$.

When the reference signal Pi becomes unavailable, the reference-signal-input detecting circuit 5 detects the disappearance of the reference signal Pi, asserting the signal Sd. Actuated by the asserted signal Sd, the switch 8 changes its position from the side of the filter 3 to the side of the constant-voltage power supply 6, forwarding the voltage $E_1$ output by the constant-voltage power supply 6 to the voltage-controlled oscillator 4 as the input voltage $VCO_{in}$. Accordingly, the voltage-controlled oscillator 4 produces the pulse-train signal Po with a frequency equal to $(fi_{AVR} \times n)$. In the case of a reference signal Pi with small fluctuations in its frequency fi, the frequency $(fi_{AVR} \times n)$ is approximately equal to fo. In this case, the PLL circuit can thus output the signal Po with about the same frequency as that obtained in a synchronized state even when the reference signal Pi becomes unavailable.

When the reference signal Pi is restored with an arbitrary phase, the difference in phase between the reference signal Pi and the signal $P_{FB}$ output by the frequency divider 2 may be large in some cases. Even in such cases, nevertheless, the time for the PLL circuit to get stabilized in the synchronized state is shorter than that for the conventional PLL circuit. This is because the voltage-controlled oscillator 4 has already been producing the output signal Po with a frequency approximately equal to that obtained in the synchronized state and, during the period in which the reference signal Pi was absent, the integrating components employed in the filter 3 was put in a short-circuit state, pulling the filter 3 out off a saturated condition.

Third Embodiment

Figure 5:
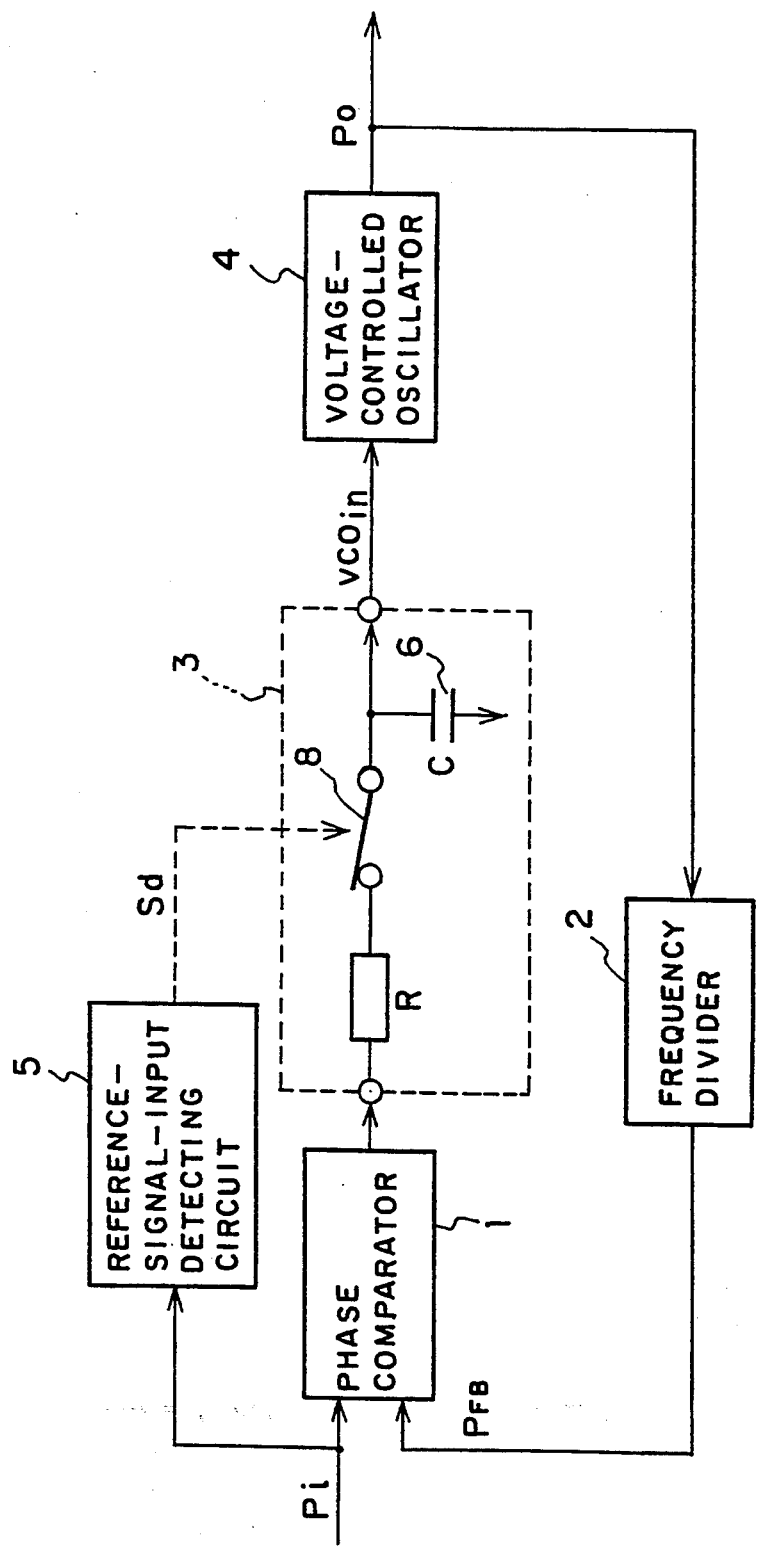
FIG. 5 is a block diagram of a third embodiment provided by the present invention.

A third embodiment of the present invention is shown in FIG. 5. Note that the same reference numerals as those shown in FIG. 1 are used in FIG. 4 to denote the same or equivalent components or elements. Also unless specified otherwise, the same notations as those used in the description of the first embodiment are used in the following explanation to denote the same electrical quantities. As shown in the figure, a filter 3 comprises typically a resistor R and a condenser C which allow the filter 3 to function as a low-pass filter with a time lag of first order. When an asserted signal Sd is received from a reference-signal-input detecting circuit 5, the condenser C is cut off from the resistor R.

With a reference signal Pi supplied, the reference-signal-input detecting circuit 5 requests the filter 3 to turn on a switch 8 inside the filter 3. In this state, the filter 3 executes its normal filtering functions, resulting in the same operation as the conventional PLL circuit. In this state, the output frequency fo has a value equal to $(fi \times n)$, where fi is the frequency of the reference signal Pi and 1/n is the frequency-division ratio of a frequency divider 2. If the frequency fi is almost the same as its average value $fi_{AVR}$, then the condenser C employed by the filter 3 is charged approximately to the voltage $E_1$.

When the reference signal Pi becomes unavailable, the reference-signal-input detecting circuit 5 detects the disappearance of the reference signal Pi, asserting the signal Sd. Actuated by the asserted signal Sd, the switch 8 cuts off the connection between the resistor R and the condenser C which are employed in the filter 3, applying the voltage $E_1$ of the electrical charge accumulated in the condenser C to the voltage-controlled oscillator 4.

Let $fi^-$ be the frequency of the reference voltage Pi immediately before its disappearance. At that time, a pulse-train signal Po with a frequency fo equal to $(fi^- \times n)$ is output by the voltage-controlled oscillator 4. In the case of a reference signal Pi with small fluctuations in its frequency fi, the frequency $fi^-$ is equal to $fi_{AVR}$. In this case, the PLL circuit can thus output the signal Po with about the same frequency as that obtained in a synchronized state even if the reference signal Pi disappears.

When the reference signal Pi is recovered, the reference-signal-input detecting circuit 5 requests the filter 3 to put back the switch 8 in an on state, restoring the normal filtering functions. The PLL circuit then transits to the same state as the synchronized state prior to the disappearance of the reference signal Pi.

It should be noted that the voltage supplied to the voltage-controlled oscillator 4 prior to the disappearance of the reference signal Pi is held by the condenser C employed by the filter 3. Accordingly, it is not necessary to know in advance the magnitude of a voltage that results in an oscillation frequency of the synchronized state.

Fourth Embodiment

Figure 6:
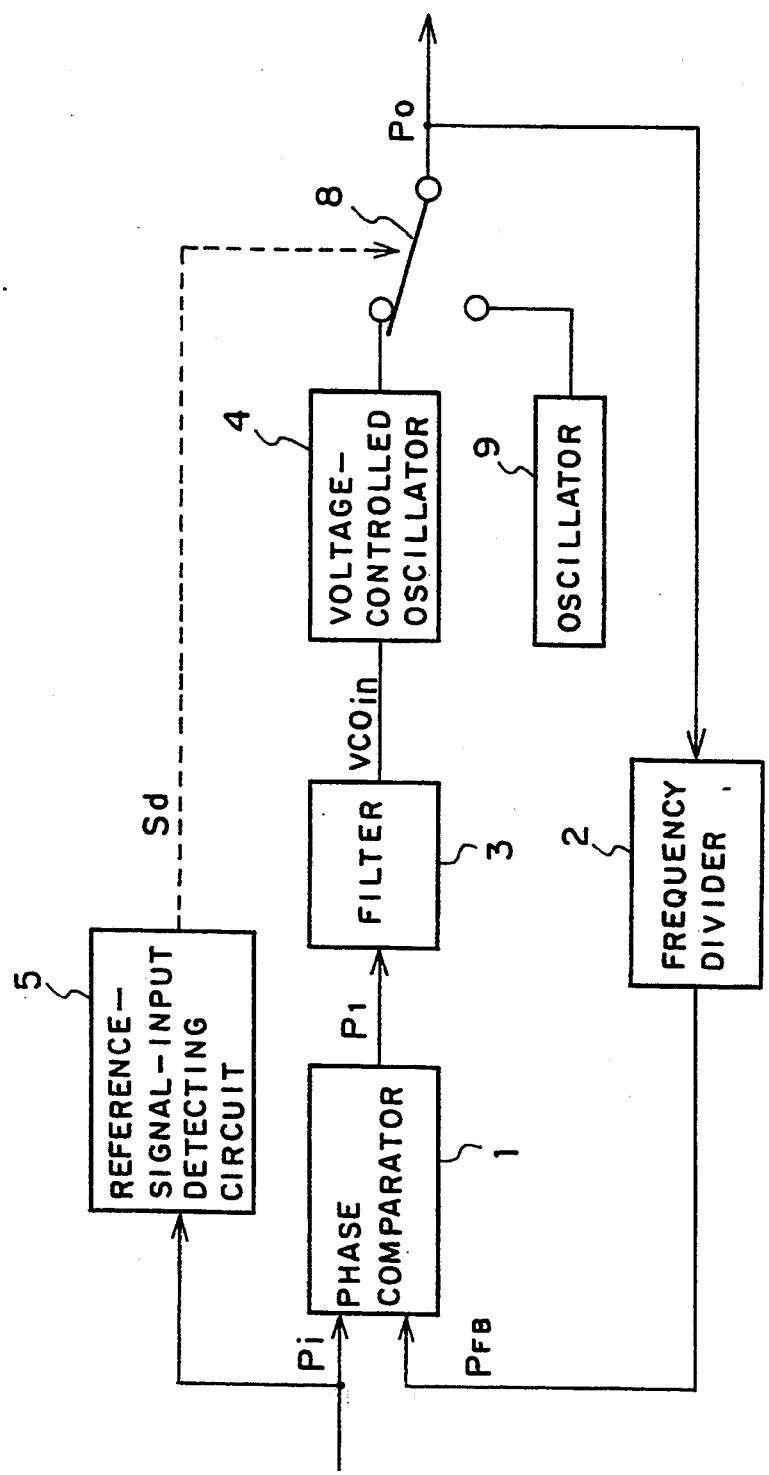
FIG. 6 is a block diagram of a fourth embodiment provided by the present invention.

A fourth embodiment of the present invention is shown in FIG. 6. Note that the same reference numerals as those shown in FIG. 1 are used in FIG. 4 to denote the same or equivalent components or elements. Also unless specified otherwise, the same notations as those used in the description of the first embodiment are used in the following explanation to denote the same electrical quantities. As shown in the figure, reference numeral 5 is a reference-signal-input detecting circuit for monitoring the existence of a reference signal Pi whereas reference numeral 9 denotes an oscillator for generating a signal with a constant frequency fox. A signal Sd output by the reference-signal-input detecting circuit 5 actuates a switch 8 to select either a signal output by a voltage-controlled oscillator 4 or the signal output by the constant-frequency oscillator 9. The oscillation frequency fox of the oscillator 9 is set at a value of ($fi_{AVR} \times n$). Typically, the constant-frequency oscillator 9 is a crystal oscillator or an equivalent.

With the reference signal Pi supplied, the reference-signal-input detecting circuit 5 deasserts the signal Sd, driving the switch 8 to select the signal generated by the voltage-controlled oscillator 4 as an output signal Po of the PLL circuit. In this state, the operation of the PLL circuit is the same as the embodiments described earlier and its description is therefore omitted. In this case, the PLL circuit is in a synchronized state, having an output frequency fo equal to ($fi \times n$).

Next, an operation with the reference signal Pi becoming unavailable for some reasons is described as follows.

The reference-signal-input detecting circuit 5 detects the disappearance of the reference signal Pi, asserting the signal Sd. Actuated by the asserted signal Sd, the switch 8 changes its position from the side of the voltage-controlled oscillator 4 to the side of the constant-frequency oscillator 9. Since the frequency fox of the constant-frequency oscillator 9 is equal to ($fi_{AVR} \times n$) as described earlier, the pulse-train signal Po is generated also at a frequency fo equal to fox. In spite of the fact that the output frequency fo in a synchronized state changes with the frequency fi of the reference signal Pi, the frequency fox is fixed. For small fluctuations in frequency fi of the reference signal Pi, the frequency fi is approximately equal to fox. Accordingly, the pulse-train signal Po is generated at an output frequency fo also approximately equal to that obtained in the synchronized state even if the reference signal Pi becomes unavailable.

When the reference signal Pi is restored, the reference-signal-input detecting circuit 5 requests the switch 8 to again select the signal output by the voltage-controlled oscillator 4, causing the PLL circuit to transit to a synchronized state. In the synchronized state, the PLL circuit carries out the same operation as that prior to the disappearance of the reference signal Pi.

Fifth Embodiment

Figure 7:
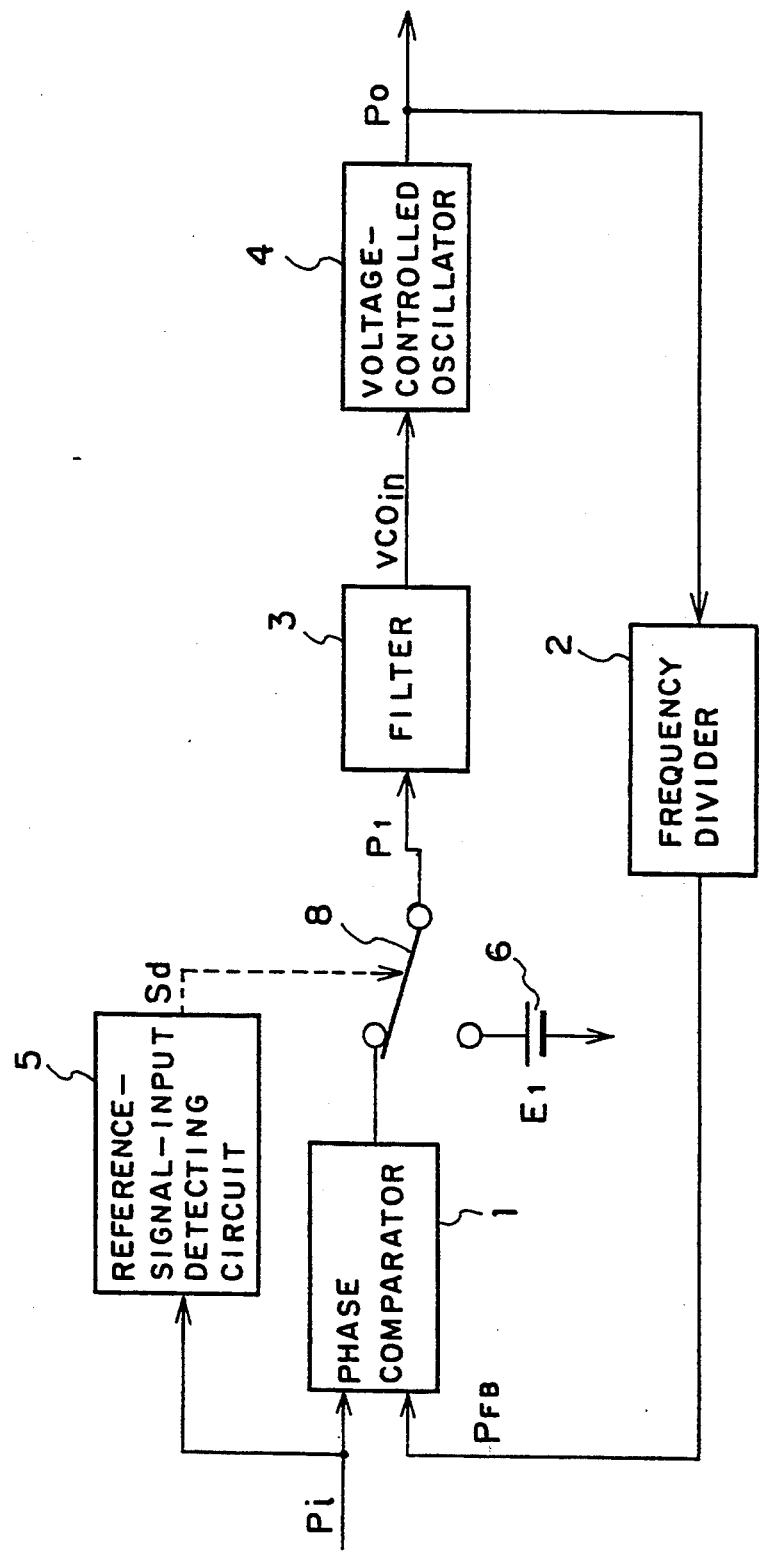
FIG. 7 is a block diagram of a fifth embodiment provided by the present invention.

A fifth embodiment of the present invention is shown in FIG. 7. Note that the same reference numerals as those shown in FIG. 1 are used in FIG. 7 to denote the same or equivalent components or elements. Also unless specified otherwise, the same notations as those used in the description of the first embodiment are used in the following explanation to denote the same electrical quantities. Reference numeral 6 shown in the figure is a constant-voltage power supply. Actuated by a signal Sd output by a reference-signal-input detecting circuit 5, a switch 8 selects either a signal output by a phase comparator 1 or a signal output by the constant-voltage power supply 6 as a voltage $P_1$ to be supplied to a filter 3. It should be noted here, however, that the constant-voltage power supply 6 can be a kind of source that generates a predetermined voltage by holding electric charge as in the case of a condenser. The constant-voltage power supply 6 is set at a voltage $E_1$ which causes the voltage-controlled oscillator 4 to produce a pulse-train signal Po with a frequency equal to ($fi_{AVR} \times n$).

When the reference signal Pi becomes unavailable, the reference-signal-input detecting circuit 5 detects the disappearance of the reference signal Pi, asserting the signal Sd. Actuated by the asserted signal Sd, the switch 8 changes its position from the side of the phase comparator 1 to that of the constant-voltage power supply 6. Being a direct-current voltage, the voltage $E_1$ output by the constant-voltage power supply 6 does not experience a voltage drop across the filter 3 except that caused by an ohmic resistor. The voltage $E_1$ is thus applied to the voltage-controlled oscillator 4 almost as it is. In this state, the voltage-controlled oscillator 4 produces the pulse-train signal Po at a frequency equal to ($fi_{AVR} \times n$). Much like the embodiments described earlier, in the case of a reference signal Pi with small fluctuations in its frequency fi, the frequency ($fi_{AVR} \times n$) is approximately equal to fo, the frequency of the pulse-train signal Po with the reference signal Pi normally supplied. In this case, the PLL circuit can thus output the signal Po with about the same frequency as that obtained in a synchronized state even if the reference signal Pi becomes unavailable.

In the case of this embodiment, some ripples contained in the voltage $E_1$ output by the constant-voltage power supply 6 are smoothed out by the filter 3. Accordingly, the effects of the ripples on the operation of the PLL circuit can be reduced.

Sixth Embodiment

Figure 8:
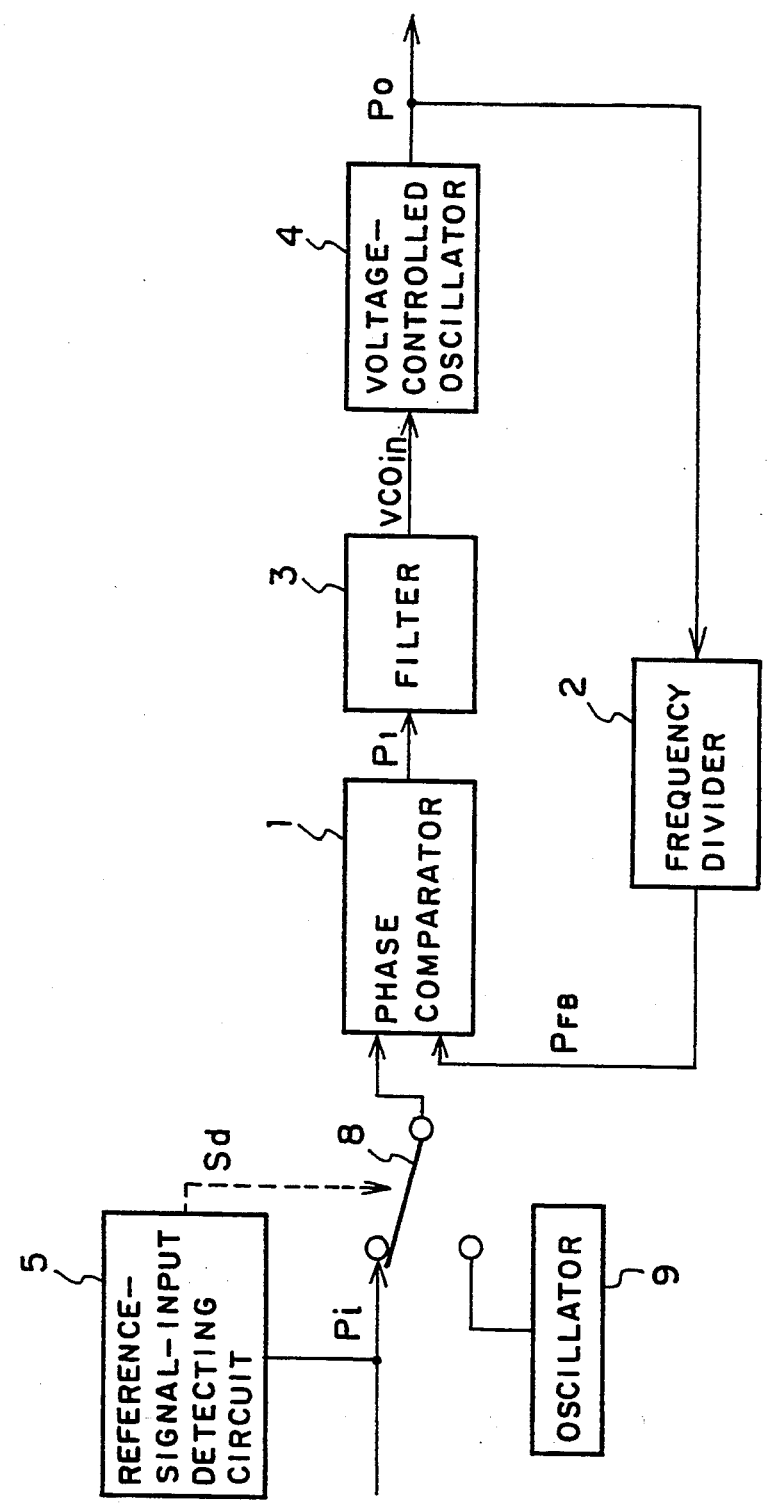
FIG. 8 is a block diagram of a sixth embodiment provided by the present invention.

A sixth embodiment of the present invention is shown in FIG. 8. Note that the same reference numerals as those shown in FIG. 1 are used in FIG. 8 to denote the same or equivalent components or elements. Also unless specified otherwise, the same notations as those used in the description of the first embodiment are used in the following explanation to denote the same electrical quantities. Reference numeral 9 shown in the figure is a constant-frequency oscillator. Actuated by a signal Sd output by a reference-signal-input detecting circuit 5, a switch 8 selects either a reference signal Pi or a signal output by the constant-frequency oscillator 9 as a voltage $P_1$ to be supplied to a filter 3. The frequency $fo_i$ of the constant-frequency oscillator 9 is set at a value equal to $fi_{AVR}$. It should be noted that the constant-frequency oscillator 9 is typically a crystal oscillator or an equivalent. In addition, the frequency $fo_i$ of the constant-frequency oscillator 9 is set at the same value as that of the reference signal Pi. Thus, a constant-frequency oscillator having a frequency lower than that of the fourth embodiment can be used.

With the reference signal Pi supplied, the switch 8 is positioned on the side of the reference signal Pi. In this state, the PLL circuit operates in the same way as the conventional PLL circuit with a voltage-controlled oscillator 4 generating a pulse-train signal Po at an output frequency fo equal to ($fi \times n$).

When the reference signal Pi becomes unavailable, the reference-signal-input detecting circuit 5 detects the disappearance of the reference signal Pi, asserting a signal Sd. Actuated by the asserted signal Sd, the switch 8 changes its position from the side of the reference signal Pi to that of the constant-frequency oscillator 9. With the switch 8 positioned on this side, the PLL circuit also functions in the same way as the conventional PLL circuit described earlier except that the reference signal Pi supplied to the phase comparator 1 is replaced by a new reference signal output by the constant-frequency oscillator 9.

In this state, the voltage-controlled oscillator 4 produces the pulse-train signal Po at a frequency equal to ($fi_{AVR} \times n$). Much like the embodiments described earlier, in the case of a reference signal Pi with small fluctuations in its frequency fi, the frequency ($fi_{AVR} \times n$) is approximately equal to fo. In this case, the PLL circuit can thus output the signal Po with about the same frequency as that obtained in a synchronized state even when the reference signal Pi becomes unavailable.

Seventh Embodiment

Figure 9:
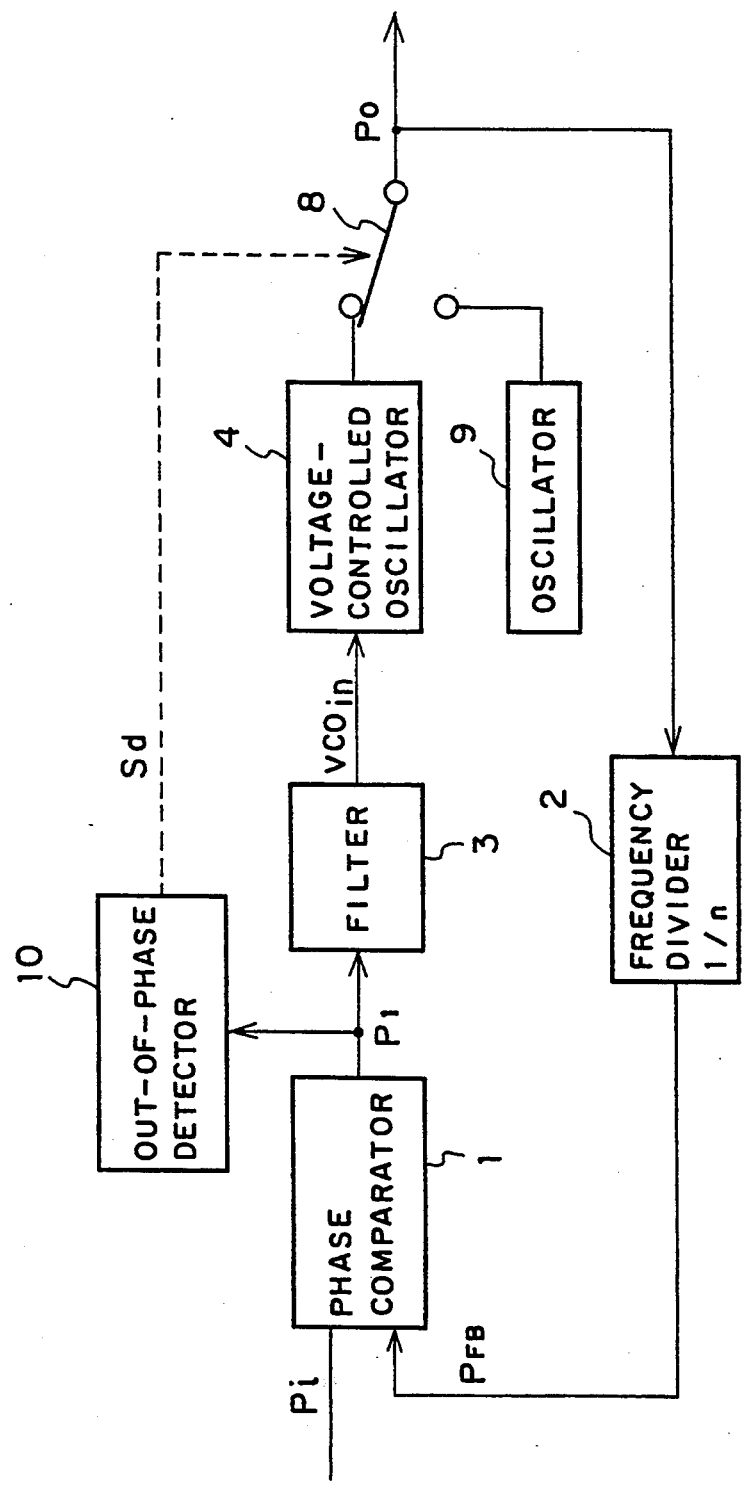
FIG. 9 is a block diagram of a seventh embodiment provided by the present invention.

A seventh embodiment of the present invention is shown in FIG. 9. It should be noted that the same reference numerals as those shown in FIG. 1 are used in FIG. 9 to denote the same or equivalent components or elements. Also unless specified otherwise, the same notations as those used in the description of the first embodiment are used in the following explanation to denote the same electrical quantities. Reference numeral 10 shown in the figure is an out-of-phase-synchronization detector for monitoring a signal P1 output by a phase detector 1. By monitoring the signal P1, the out-of-phase-synchronization detector 10 determines whether or not the PLL circuit is in a synchronized state. Reference numeral 9 is a constant-frequency oscillator for generating a signal with a fixed frequency fox. Actuated by a signal Sd produced by the out-of-phase-synchronization detector 10, a switch 8 selects either a signal output by a voltage-controlled oscillator 4 or a signal output by the constant-frequency oscillator 9. Here, the frequency fox of the signal output by the constant-frequency oscillator 9 is set at a value equal to ($fi_{AVR} \times n$).

When the PLL circuit operates normally, the signal $P_1$ output by the phase detector 1 has a magnitude fluctuating within a fixed range, in which case the out-of-phase-synchronization detector 10 determines that the PLL circuit is in a synchronized state. In this state, the switch 8 selects the signal output by the voltage-controlled oscillator 4 and the PLL circuit operates in the same way as the conventional PLL circuit. The description of the PLL circuit in this state is therefore omitted. In the synchronized state, the voltage-controlled oscillator 4 generates the pulse-train signal Po at a frequency fo equal to (fi×n).

When an abnormality occurs in the PLL circuit, however, the magnitude of the signal $P_1$ output by the phase comparator 1 exceeds a permissible limit. If this state continues for a certain period of time, the out-of-phase-synchronization detector 10 will determine that the PLL circuit is not operating normally, asserting a signal Sd. The asserted signal Sd changes the position of the switch 8 from the side of the voltage-controlled oscillator 4 to that of the constant-frequency oscillator 9. With the switch 8 positioned on this side, the PLL circuit generates the pulse-train signal Po with a frequency fox equal to ($fi_{AVR} \times n$) as an output signal. As shown in the figure, the pulse-train signal Po is also supplied to a frequency divider 2.

The output frequency fo in a synchronized state changes with the frequency fi of the reference signal Pi. However, the frequency fox is constant. In the case of small fluctuations in frequency fi of the reference signal Pi, the output frequency is approximately equal to the constant frequency fox. Therefore, even when the PLL circuit is not operating normally in an out-of-phase-synchronization state, the pulse-train signal Po is generated at an output frequency approximately equal to the frequency obtained in the synchronized state. After the switch 8 has selected the signal output by the constant-frequency oscillator 9 as the output signal Po, the PLL circuit forms an open-loop circuit with no feedback. In this state, the circuit will not re-enter the synchronized state instantly. Accordingly, the switch 8 also will not be positioned back to the side of the voltage-controlled oscillator 4 as before immediately.

In this way, the PLL circuit is not restored to a synchronized state promptly once an abnormality has occurred. In the mean time, the PLL circuit can be inspected in order to determine the cause of the failure, resulting in convenient maintenance.

Eighth Embodiment

Figure 10:
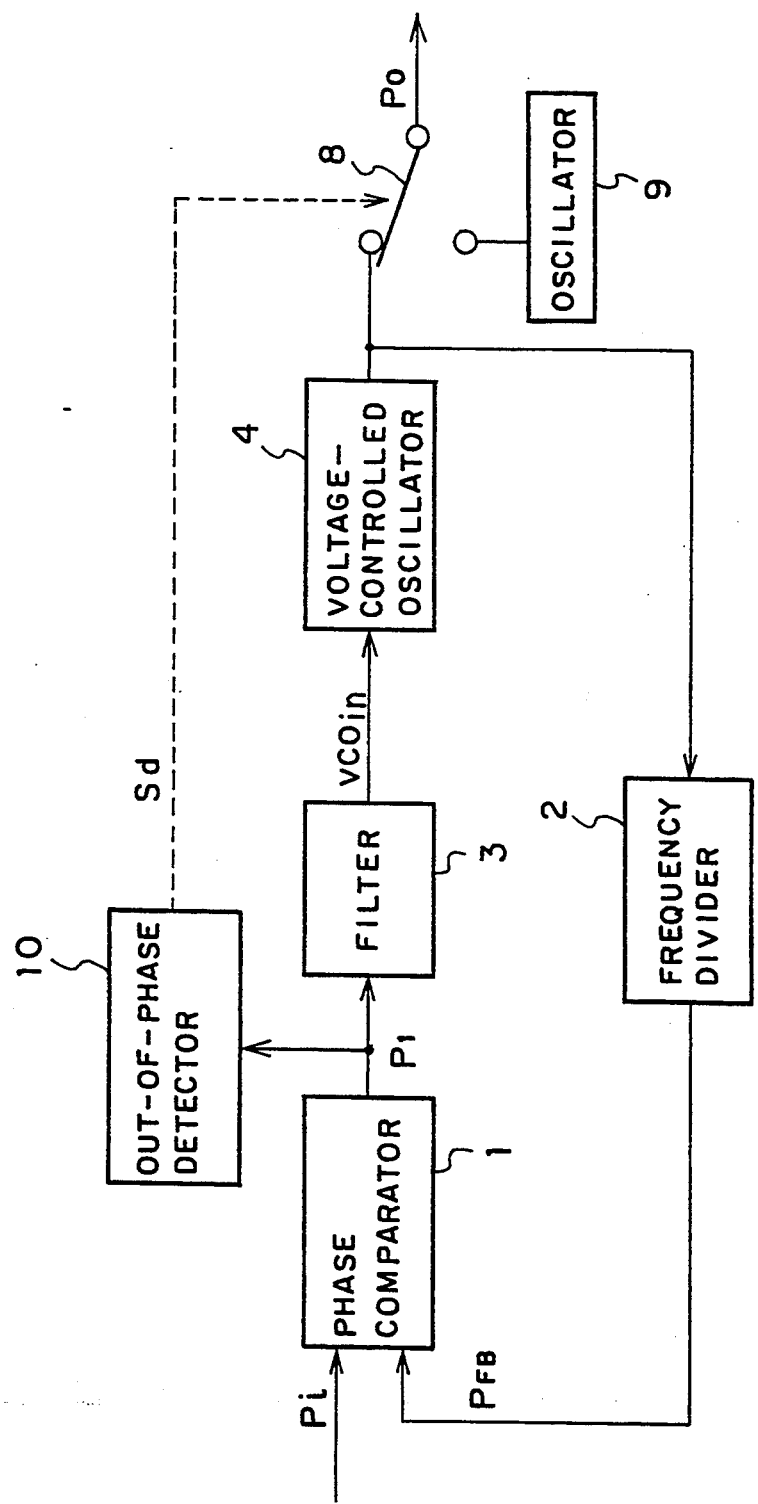
FIG. 10 is a block diagram of a eighth embodiment provided by the present invention.
Figure 11:
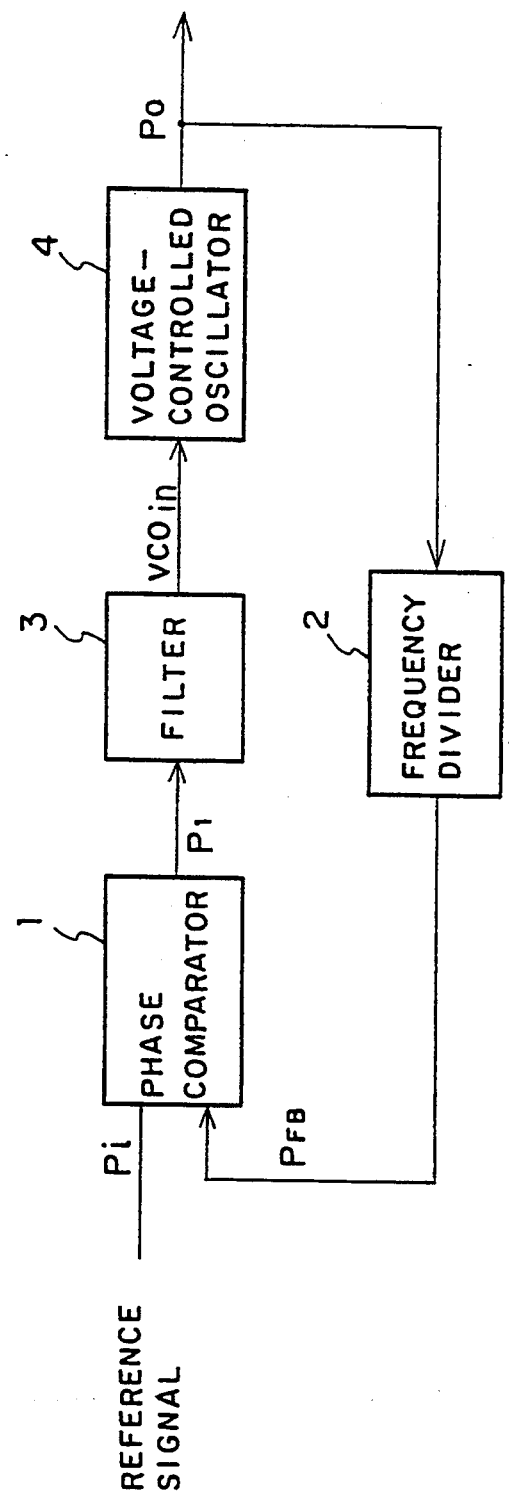
FIG. 11 is a block diagram of the conventional PLL circuit.

An eighth embodiment of the present invention is shown in FIG. 10. Note that the same reference numerals as those used for the fourth embodiment shown in FIG. 1 are used in FIG. 9 to denote the same or equivalent components or elements. Also unless specified otherwise, the same notations as those used in the description of the first embodiment are used in the following explanation to denote the same electrical quantities. Reference numeral 10 shown in the figure is an out-of-phase-synchronization detector for monitoring a signal $P_1$ output by a phase detector 1. By monitoring the signal P1, the out-of-phase-synchronization detector 10 determines whether or not the PLL circuit is in a synchronized state. Reference numeral 9 is a constant-frequency oscillator for generating a signal with fixed frequency. Actuated by an abnormality signal Sd output by the out-of-phase-synchronization detector 10, a switch 8 selects either a signal output by a voltage-controlled oscillator 4 or a signal output by the constant-frequency oscillator 9. Here, the frequency fox of the constant-frequency oscillator 9 is set at a value equal to ($fi_{AVR} \times n$).

When the PLL circuit operates normally, the switch 8 selects the signal output by the voltage-controlled oscillator 4 and the PLL circuit operates in the same way as the conventional PLL circuit. The PLL circuit is in the synchronized state, wherein the voltage-controlled oscillator 4 generates the pulse-train signal Po at a frequency fo equal to (fi×n).

When an abnormality occurs in the PLL circuit, however, the out-of-phase-synchronization detector asserts the abnormality signal Sd. The asserted signal Sd changes the position of the switch 8 from the side of the voltage-controlled oscillator 4 to that of the constant-frequency oscillator 9. With the switch 8 positioned on this side, the PLL circuit generates the pulse-train signal Po with a frequency fox equal to ($fi_{AVR} \times n$) as an output signal. As shown in the figure, the signal output by the voltage-controlled oscillator 4 remains supplied to a frequency divider 2.

The output frequency fo in a synchronized state changes with the frequency fi of the reference signal Pi. However, the frequency fox is constant. In the case of small fluctuations in frequency fi of the reference signal Pi, the output frequency is almost equal to the constant frequency fox. Therefore, even when the PLL circuit is not operating normally in an out-of-phase-synchronization state, the pulse-train signal Po is generated at an output frequency approximately equal to the frequency obtained in the synchronized state.

In the out-of-phase-synchronization state, the switch 8 forwards the signal output by the constant-frequency oscillator 9 as the output signal Po of the PLL circuit. However, the signal output by the voltage-controlled oscillator 4 remains supplied to the frequency divider 2. Accordingly, the PLL circuit also remains as a closed-loop circuit with a feedback as it is. As a result, when the reference signal Pi is restored to a normal state, terminating the abnormal condition, the PLL circuit returns to a synchronized state. The out-of-phase-synchronization detector 10 detects this synchronized state, turning off the switch 8. With the switch 8 turned off, the signal generated by the voltage-controlled oscillator 4 is again selected as the output signal of the PLL circuit. In the synchronized state, the PLL circuit functions in the same way as the conventional PLL circuit.

The present invention has been so far described in detail with particular reference to the preferred embodiments thereof. It should be understood expressly, however, that the preferred embodiments by no means serve as a definition of limits of the present invention. Variations and modifications within the range defined by claims that follow can also be implemented as well.

What is claimed is:

1. A phase locked loop circuit for generating an output signal from a reference signal at a frequency equal to a multiple of the frequency of said reference signal, said phase locked loop circuit comprising:
   a phase comparator for comparing the phase of said reference signal with the phase of a comparison signal and for outputting a phase-difference signal representing a difference in phase between said reference signal and said comparison signal;
   a reference-signal detector for detecting existence/non-existence of said reference signal;
   a filter circuit for passing components of a predetermined band out off said phase-difference signal, said filter circuit comprising an integrating component and a switch for putting said integrating component in a short-circuit state in the event of said reference-signal detector's detecting non-existence of said reference signal;
   a direct-current power supply for generating a direct-current signal having a predetermined voltage;
   an adder for adding a signal output by said filter circuit to said direct-current signal;
   a voltage-controlled oscillator for generating said output signal with a frequency based on the voltage of a signal output by said adder; and
   a frequency divider for dividing the frequency of said output signal generated by said voltage-controlled oscillator by a predetermined frequency-multiplication factor to produce said comparison signal to be supplied to said phase comparator.

2. A phase locked loop circuit for generating an output signal from a reference signal at a frequency equal to a multiple of the frequency of said reference signal, said phase locked loop circuit comprising:
   a phase comparator for comparing the phase of said reference signal with the phase of a comparison signal and for outputting a phase-difference signal representing a difference in phase between said reference signal and said comparison signal;
   a reference-signal detector for detecting existence/non-existence of said reference signal;
   a filter circuit for passing components of a predetermined band out of said phase-difference signal, said filter circuit comprising an integrating component and a switch for putting said integrating components in a short-circuit state in the event of said reference-signal detector's detecting non-existence of said reference signal;
   a direct-current power supply for generating a direct-current signal having a predetermined voltage;
   a select switch for selecting said direct-current signal generated by said direct-current power supply in the event of said reference-signal detector's detecting non-existence of said reference signal and for selecting a signal output by said filter circuit in the event of said reference-signal detector's detecting existence of said reference signal;
   a voltage-controlled oscillator for generating said output signal with a frequency based on the voltage of a signal selected by said select switch; and
   a frequency divider for dividing the frequency of said output signal generated by said voltage-controlled oscillator by a predetermined frequency-multiplication factor to produce said comparison signal to be supplied to said phase comparator.

3. A phase locked loop circuit for generating an output signal from a reference signal at a frequency equal to a multiple of the frequency of said reference signal, said phase locked loop circuit comprising:
   a phase comparator for comparing the phase of said reference signal with the phase of a comparison signal and for outputting a phase-difference signal representing a difference in phase between said reference signal and said comparison signal;
   a reference-signal detector for detecting existence/non-existence of said reference signal;
   a filter circuit comprising a resistor, a switch and a condenser with one end of said resistor connected to the output of said phase comparator, the other end of said resistor connected to one end of said switch, the other end of said switch connected to one end of said condenser and the other end of said condenser grounded, said filter circuit opening said switch in the event of said reference-signal detector's detecting non-existence of said reference signal and closing said switch in the event of said reference-signal detector's detecting existence of said reference signal;
   a voltage-controlled oscillator for generating said output signal with a frequency based on the voltage of a signal output by said filter circuit; and
   a frequency divider for dividing the frequency of said output signal generated by said voltage-controlled oscillator by a predetermined frequency-multiplication factor to produce said comparison signal to be supplied to said phase comparator.

4. A phase locked loop circuit for generating an output signal from a reference signal at a frequency equal to a multiple of the frequency of said reference signal, said phase locked loop circuit comprising:
   a phase comparator for comparing the phase of said reference signal with the phase of a comparison signal and for outputting a phase-difference signal representing a difference in phase between said reference signal and said comparison signal;
   a reference-signal detector for detecting existence/non-existence of said reference signal;
   a filter circuit for passing components of a predetermined band out of said phase-difference signal;
   a voltage-controlled oscillator for generating a signal with a frequency based on the voltage of a signal output by said filter circuit;
   a constant-frequency oscillator for generating a constant-frequency signal at a constant frequency;
   a select switch for selecting said constant-frequency signal generated by said constant-frequency oscillator in the event of said reference-signal detector's detecting non-existence of said reference signal and for selecting said signal output by said voltage-controlled oscillator in the event of said reference-signal detector's detecting existence of said reference signal and forwarding a selected signal as said output signal; and a frequency divider for dividing the frequency of said output signal selected by said select switch by a predetermined frequency-multiplication factor to produce said comparison signal to be supplied to said phase comparator.

5. A phase locked loop circuit for generating an output signal from a reference signal at a frequency equal to a multiple of the frequency of said reference signal, said phase locked loop circuit comprising:

a phase comparator for comparing the phase of said reference signal with the phase of a comparison signal and for outputting a phase-difference signal representing a difference in phase between said reference signal and said comparison signal;

a reference-signal detector for detecting existence/-non-existence of said reference signal;

a direct-current power supply for generating a direct-current signal having a predetermined voltage;

a select switch for selecting said direct-current signal output by said direct-current power supply in the event of said reference-signal detector's detecting non-existence of said reference signal and for selecting said phase-difference signal output by said phase comparator in the event of said reference-signal detector's detecting existence of said reference signal;

a filter circuit for passing components of a predetermined band out of a signal selected by said select switch;

a voltage-controlled oscillator for generating said output signal with a frequency based on the voltage of a signal output by said filter circuit; and a frequency divider for dividing the frequency of said output signal generated by said voltage-controlled oscillator by a predetermined frequency-multiplication factor to produce said comparison signal to be supplied to said phase comparator.

6. A phase locked loop circuit for generating an output signal from a reference signal at a frequency equal to a multiple of the frequency of said reference signal, said phase locked loop circuit comprising:

a phase comparator for comparing the phase of said reference signal with the phase of a comparison signal and for outputting a phase-difference signal representing a difference in phase between said reference signal and said comparison signal;

a filter circuit for passing components of a predetermined band out of said phase-difference signal output by said phase comparator;

a voltage-controlled oscillator for generating a signal with a frequency based on the voltage of a signal output by said filter circuit;

a phase-synchronization detector for detecting an out-of-phase-synchronization state based on said phase-difference signal output by said phase comparator;

a constant-frequency oscillator for generating a constant-frequency signal at a constant frequency;

a select switch for selecting said constant-frequency signal output by said constant-frequency oscillator in the event of said phase-synchronization detector's detecting an out-of-phase-synchronization state or said signal generated by said voltage-control oscillator in the event of said out-of-synchronization detector's detecting no out-of-phase-synchronization state and for forwarding the selected signal as said output signal; and a frequency divider for dividing the frequency of said output signal selected by said select switch by a predetermined frequency-multiplication factor to produce said comparison signal to be supplied to said phase comparator.

7. A phase locked loop circuit for generating an output signal from a reference signal at a frequency equal to a multiple of the frequency of said reference signal, said phase locked loop circuit comprising:

a phase comparator for comparing the phase of said reference signal with the phase of a comparison signal and for outputting a phase-difference signal representing a difference in phase between said reference signal and said comparison signal;

a filter circuit for passing components of a predetermined band out of said phase-difference signal output by said phase comparator;

a voltage-controlled oscillator for generating a signal with a frequency based on the voltage of a signal output by said filter circuit;

a phase-synchronization detector for detecting an out-of-phase-synchronization state based on said phase-difference signal output by said phase comparator;

a constant-frequency oscillator for generating a constant-frequency signal;

a select switch for selecting said constant-frequency signal output by said constant-frequency oscillator in the event of said phase-synchronization detector's detecting an out-of-phase-synchronization state, for selecting said signal generated by said voltage,control oscillator in the event of said out-of-phase-synchronization detector's detecting no out-of-phase-synchronization state and for forwarding the selected signal as said output signal; and a frequency divider for dividing the frequency of said signal generated by said voltage-control oscillator by a predetermined frequency-multiplication factor to produce said comparison signal to be supplied to said phase comparator.

* * * * *